United States Patent
Vichniakov et al.

(10) Patent No.: US 10,507,553 B2
(45) Date of Patent: Dec. 17, 2019

(54) METHOD FOR RECONDITIONING OF A DAMAGED PORTION OF A COMPONENT AND INSERT THEREFOR

(71) Applicant: Airbus Operations GmbH, Hamburg (DE)

(72) Inventors: Alexei Vichniakov, Hamburg (DE); Waldemar Michelson, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 100 days.

(21) Appl. No.: 15/697,691

(22) Filed: Sep. 7, 2017

(65) Prior Publication Data

US 2018/0133850 A1     May 17, 2018

(30) Foreign Application Priority Data

Nov. 11, 2016   (EP) .................................... 16198503

(51) Int. Cl.
*B23P 6/00*      (2006.01)
*G06F 17/50*     (2006.01)
(Continued)

(52) U.S. Cl.
CPC .................... *B23P 6/00* (2013.01); *B64F 5/40* (2017.01); *G06F 17/50* (2013.01);
(Continued)

(58) Field of Classification Search
CPC ...... B23P 6/005; F01D 5/005; G06F 17/5009; G06F 17/5095
See application file for complete search history.

(56) References Cited

U.S. PATENT DOCUMENTS 7,810,237 B2   10/2010 Lange et al.
8,474,137 B2    7/2013 Richter et al.
(Continued)

FOREIGN PATENT DOCUMENTS

DE    102012013949 A1    1/2014
DE      10319494 A1     11/2014
(Continued)

OTHER PUBLICATIONS

Niu, "Airframe Structural Design, Practical Design Information and Data on Aircraft Structures", 1988 Conmilit Press Ltd., Eighth printing, Jan. 1995, p. 303.
(Continued)

*Primary Examiner* — Jun S Yoo
(74) *Attorney, Agent, or Firm* — Lorenz & Kopf LLP

(57) ABSTRACT

According to an embodiment, a method is provided for preparing a reconditioning of a damaged portion of a component, particularly of an aircraft, by adding an insert, which fills and/or bridges the damaged portion. The method involves: producing a 3D CAD repair model of the damaged portion by scanning; analyzing the repair model and thus evaluating complexity of the damage and/or its reconditioning; as a function of the complexity, deciding between at least two alternative means to perform at least a following step, which is analyzing the repair model and thus dimensioning the reconditioning including the insert. Further, an insert is provided for filling and/or bridging a damaged portion for reconditioning of the damaged portion of a component, particularly of an aircraft, produced according to the method.

10 Claims, 6 Drawing Sheets

(51) Int. Cl.
  *B64F 5/40* (2017.01)
  *B29C 73/06* (2006.01)
  *B32B 43/00* (2006.01)
  *B64C 1/12* (2006.01)

(52) U.S. Cl.
  CPC ...... *G06F 17/5095* (2013.01); *B23P 2700/01* (2013.01); *B29C 73/06* (2013.01); *B32B 43/00* (2013.01); *B64C 1/12* (2013.01)

(56) References Cited

U.S. PATENT DOCUMENTS

| | | | |
|---|---|---|---|
| 8,910,361 B2 | 12/2014 | Rickenbacher et al. | |
| 9,085,980 B2 | 7/2015 | Mittendorf et al. | |
| 2007/0084047 A1* | 4/2007 | Lange | B23P 6/005 29/889.1 |
| 2009/0271985 A1* | 11/2009 | Lange | B22F 3/1055 29/889.1 |
| 2010/0161095 A1 | 6/2010 | Lindgren | |
| 2010/0274545 A1 | 10/2010 | Greenberg et al. | |
| 2011/0099809 A1* | 5/2011 | Hovel | B23P 6/005 29/888 |
| 2011/0099810 A1 | 5/2011 | Stankowski et al. | |
| 2011/0264413 A1 | 10/2011 | Stankowski et al. | |
| 2012/0198676 A1 | 8/2012 | Rickenbacher et al. | |
| 2012/0296460 A1 | 11/2012 | Hadley et al. | |
| 2016/0075028 A1 | 3/2016 | Bain et al. | |
| 2016/0121438 A1 | 5/2016 | Ladewig et al. | |
| 2016/0263845 A1 | 9/2016 | Delehouze et al. | |

FOREIGN PATENT DOCUMENTS

| | | |
|---|---|---|
| EP | 2282931 A1 | 2/2011 |
| EP | 2317076 A2 | 5/2011 |
| EP | 2777867 A1 | 9/2014 |
| EP | 2873620 A1 | 5/2015 |
| FR | 812036 A | 4/1937 |
| FR | 2978070 A1 | 1/2013 |
| WO | 2005000672 A1 | 1/2005 |
| WO | 2012114047 A1 | 8/2012 |
| WO | 2015023506 A1 | 2/2015 |

OTHER PUBLICATIONS

European Patent Office, Extended European Search Report for European Patent Application No. 16198503.1 dated May 18, 2017.

* cited by examiner

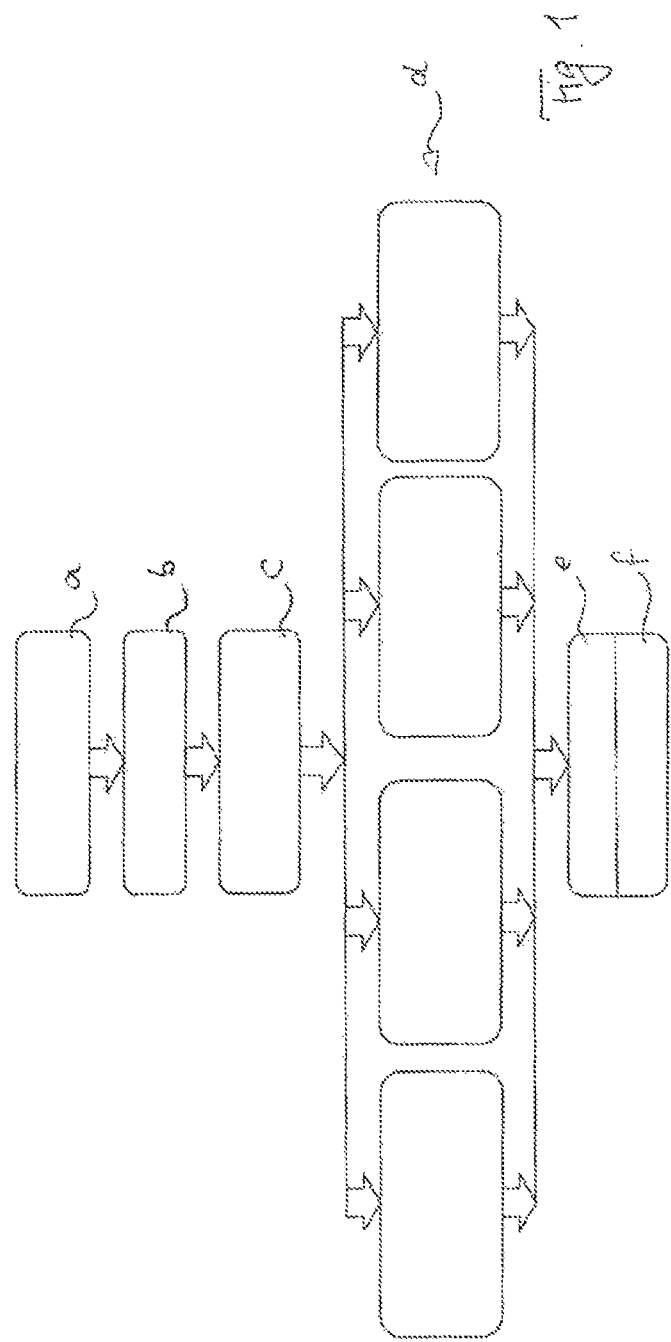

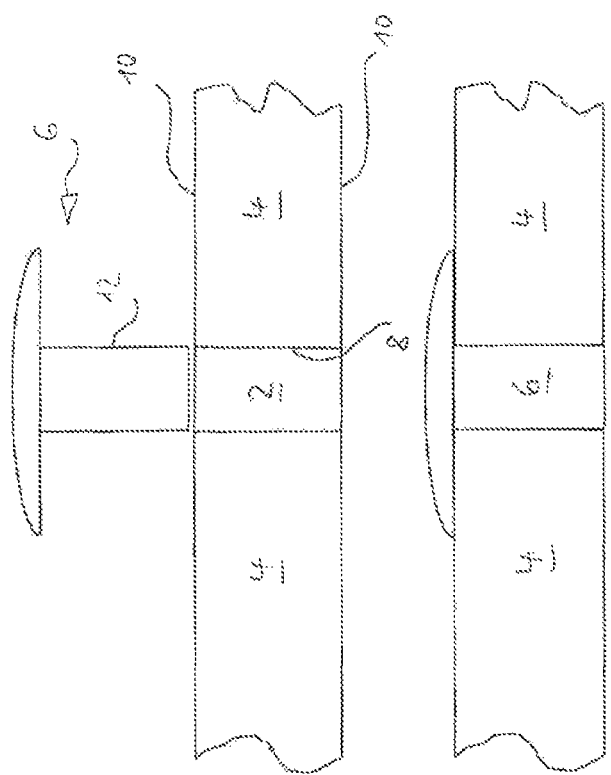

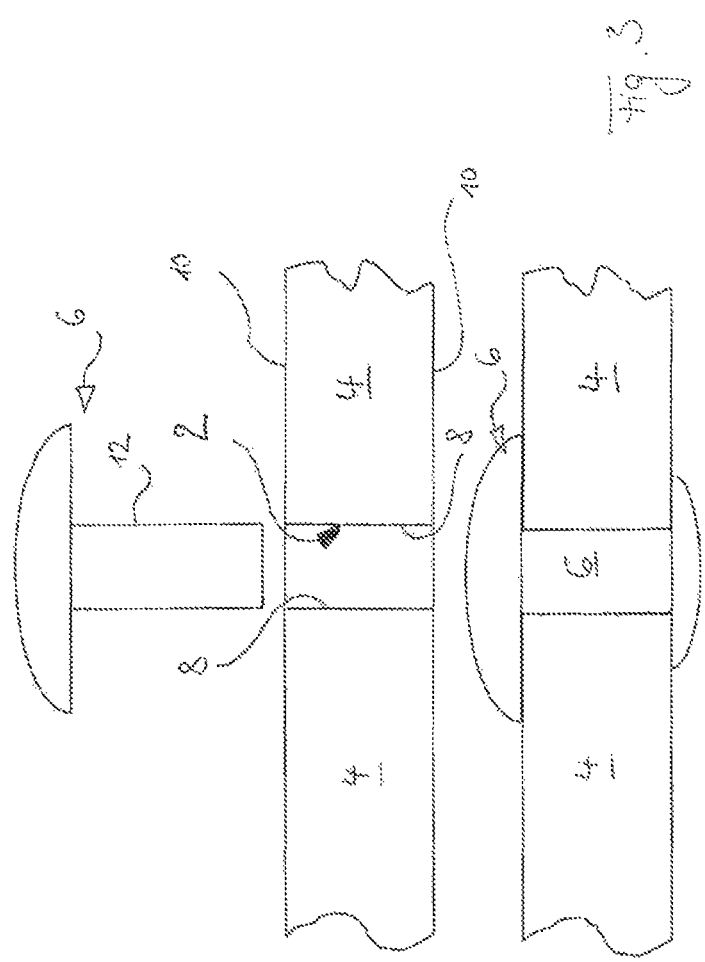

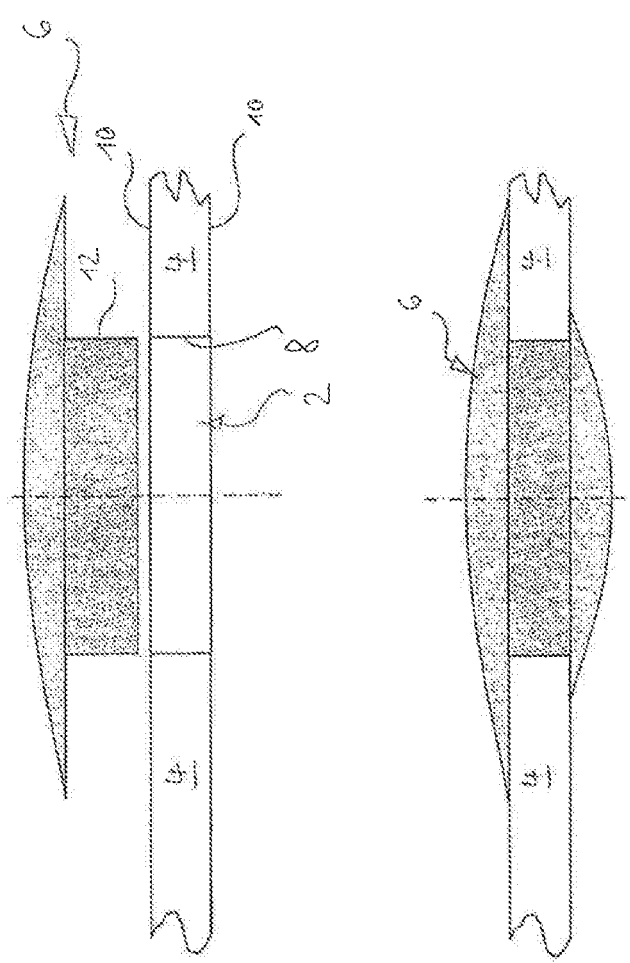

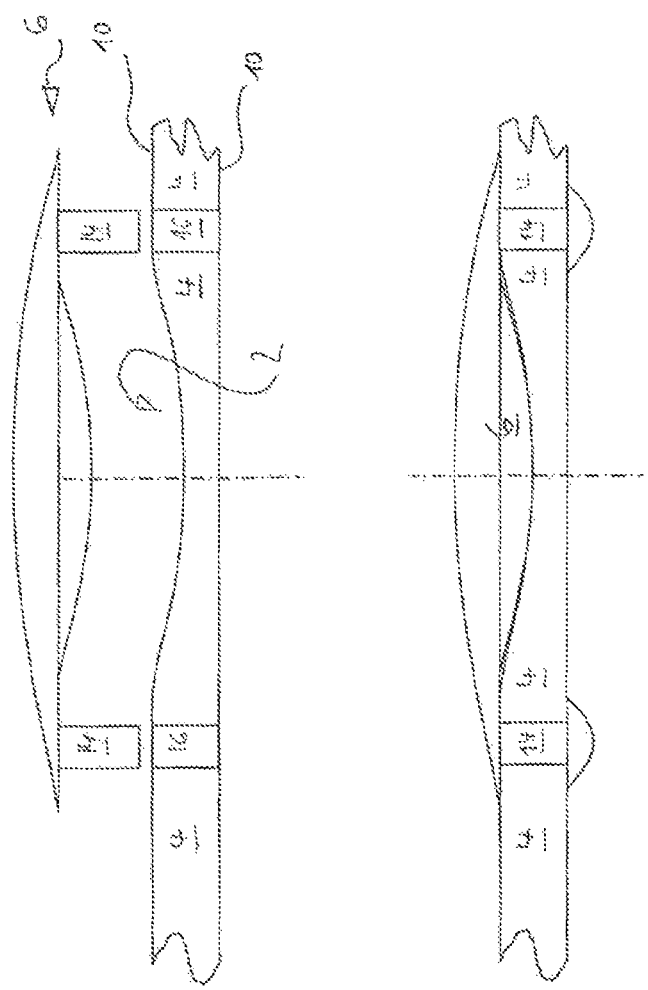

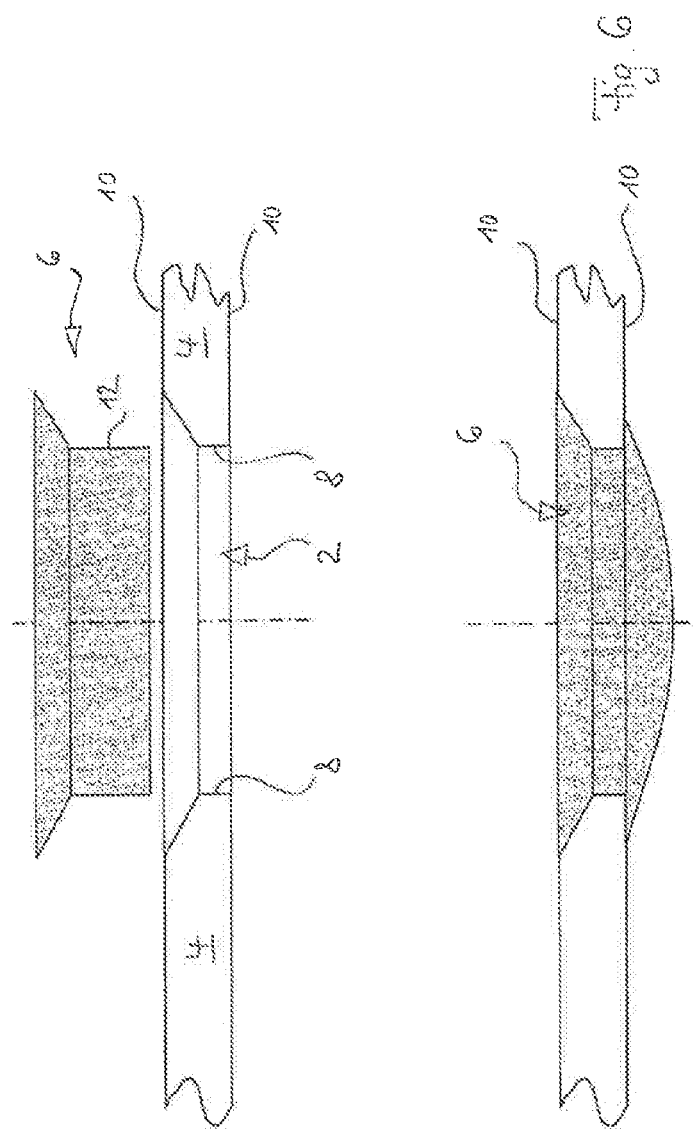

METHOD FOR RECONDITIONING OF A DAMAGED PORTION OF A COMPONENT AND INSERT THEREFOR

CROSS-REFERENCE TO PRIORITY APPLICATION(S)

This application claims the benefit of, and priority to, European patent application number 16198503.1, filed Nov. 11, 2016.

TECHNICAL FIELD

Embodiments of the subject matter described herein relate generally to a method for preparing a reconditioning and to a method for reconditioning of a damaged portion of a component, particularly of an aircraft, by adding an insert, which fills and/or bridges the damaged portion and to such an insert therefor.

BACKGROUND

As an example for a repair process having a high standard of security demands, the repair process of a damaged component of an aircraft presently comprises some burdens in particular for the owner or operator of the aircraft in terms of:

Repair possibility as per Structure Repair Manual: for some areas neither is it is allowed to apply Allowable Damage Limits nor conventional skin repair, e.g., by doubler installation.

High timely effort is required for producing the appropriate repair embodiment.

The aircraft producer and the owner or operator of the aircraft have to store a lot of parts for repair on the stock, only by way of example metal doubler sheets in several dimensions and thicknesses, several stringer profiles, several frame profiles, several cross beam profiles, and several fastener types.

Weight increases at use of the known doubler skin repair.

Design rules for aircraft structure development form a margin for conventional repair solutions.

Accordingly, it is desirable to have an improved reconditioning methodology that addresses the shortcomings of existing solutions. Furthermore, other desirable features and characteristics will become apparent from the subsequent detailed description and the appended claims, taken in conjunction with the accompanying drawings and the foregoing technical field and background.

BRIEF SUMMARY

Certain problems and disadvantages are addressed and solved by a method and an insert described herein. Exemplary embodiments of the invention are encompassed by the claims.

According to embodiments of the invention, a method is disclosed for preparing a reconditioning of a damaged portion of a technical component, particularly of an aircraft and particularly of an integral component like a skin component, which in particular is integrally formed of one material or which, e.g., comprises a part which is integrally formed of one material and frames the component. The reconditioning is meant to be performed by adding an insert, which fills and/or bridges the damaged portion. The method comprises the steps of: Producing a 3D CAD repair model of the damaged portion by scanning (step a; for example optically, stereooptically, lenticular optically, by means of laser, infrared and/or with a Time of Flight camera). A later step b is analysing the repair model and thus evaluating complexity of the damage and/or its reconditioning. A later step c is, as a function of the complexity, deciding between at least two alternative means to perform at least a following step d (preferably according to an accordingly programmed decision matrix). And the later step d is analysing, by that decided means, the repair model and thus dimensioning the reconditioning including the insert.

Accordingly, respective simpler repair preparation steps may be performed, e.g., by the aircraft owner's or operator's repair departments, whereas repair preparation steps, found to be more complex, which may require further specialized computer programs and/or computers, may be performed at accordingly specialized firms or at the aircraft producer's own repair departments. Accordingly, the at least two alternative means may be at least two different computer programs and/or at least two computers (possibly in two different locations)—which still may be reached by the aircraft owner's or operator's repair departments via some data network or even via the internet, so that the required calculation power is available depending on the evaluated complexity of the damage and/or its reconditioning. At least one of the at least two alternative means may be according to a Standard Repair Manual and/or may even be a natural person's calculation.

The method may be followed by the additional step e of producing the insert (in particular by means of CAM and/or by means of 3D printing possibly involving aluminum, titanium, steel and/or magnesium also as alloy and/or powder, and/or synthetic material including composites, possibly fibre-reinforced, possibly using short fibres, carbon fibres and/or glass fibres). The method may be completed to be a full method for reconditioning of the damaged portion by the following step f of inserting the insert into the damaged portion and fastening the insert to the component (possibly involving gluing, riveting, welding, brazing, soldering and/or pressing).

The method may comprise the step of working the damaged portion (in particular by removing material from the damaged portion, in particular by means of CAM)—preferably such that the damaged portion and/or the CAD repair model (if updated) is simplified. Preferably, this working step is performed after the step (b) of analysing the repair model and thus evaluating complexity of the damage and/or its reconditioning—particularly, so that the working step will be based on the information, exactly how the CAD repair model may be simplified by this working step. After that working step, the 3D CAD repair model (now of the worked damaged portion) may be updated or newly be produced by scanning, e.g. by step a, (and/or the further steps are based on the previously analysed (CAM) machine instruction information for the working step, being CAD/CAM data with preference, according to which the damaged portion is simplified). Then, the repair model (now of the worked damaged portion) may be analysed, e.g. performing step b again, and thus the complexity of the damage and/or its reconditioning newly evaluated. After that, the method may be continued with the step (c) of deciding between the at least two alternative means as a function of the complexity—preferably being lower now as a result of the working step.

For simpler performance and better results, step b of analysing the repair model and thus evaluating complexity of the damage and/or its reconditioning may be performed by comparing the repair model with a 3D CAD original model of the damaged portion in an original and undamaged status. This may be provided by the aircraft producer, as it exists there preferably in all required detail from designing and developing the aircraft. This step of analysing the repair model and thus evaluating complexity of the damage and/or its reconditioning may be performed by using dimensional and/or mechanical parameters and/or information of the CAD damage and/or original model.

Step d (of analysing, by the decided means, the repair model and thus dimensioning the reconditioning including the insert) may be performed by calculating dimensional and/or mechanical parameters of the reconditioning including the insert—and provide for as many as possible or preferably all information required to produce the insert (in the later optional step e). Also step d, for simpler performance and better results, may be performed by comparing the repair model with a 3D CAD original model of the damaged portion in an original and undamaged status.

At the optional step of producing the insert, the insert preferably is produced having at least one surface complementary to the damaged portion and/or the CAD repair model. This is particularly advantageous in combination with the step of working the damaged portion, where the portion may be prepared for a simpler shape of the insert, which will fit into the damaged portion (particularly its worked, simplified area) in a complementary way.

And/or the insert may be produced having at least one fastening structure (a pin or a rivet, e.g.) integrated, in particular as being one piece and/or of one material (made by 3D printing, e.g.). Then the method preferably comprises the step of working the damaged portion and, thus, creating a complementary structure adopted to cooperate with the fastening structure. This again is preferably by removing material from the damaged portion and/or by means of CAM—and creating a complementary structure (like a hole for the pin) adopted to cooperate with the fastening structure.

Embodiments of the invention provide an insert for filling and/or bridging a damaged portion for reconditioning of the damaged portion of a component, particularly of an aircraft, produced according to the method described so far—wherein the method may also be performed without step c: wherein then an insert (particularly with the integrated fastening structure) is prepared without deciding between at least two means to perform at least step d.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a flow diagram of a method according to an embodiment of the invention;

FIG. 2 is a schematic sectional view of an insert inserted into a damaged portion;

FIG. 3 is a schematic sectional view of an alternative insert inserted into a different damaged portion;

FIG. 4 is a schematic sectional view of an alternative insert inserted into a different damaged portion;

FIG. 5 is a schematic sectional view of an alternative insert inserted into a different damaged portion; and FIG. 6 is a schematic sectional view of an alternative insert inserted into a different damaged portion.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

FIG. 1 shows a flow diagram of the method according to an embodiment of the invention for preparing a reconditioning of a damaged portion 2 (FIG. 2 to FIG. 5) of a technical component 4 of an aircraft (not shown) and particularly of an integral component 4 namely a skin component 4, which is integrally formed of one material. The reconditioning is performed by adding an insert 6, which fills and/or bridges the damaged portion 2.

The method (FIG. 1) comprises the steps of: Producing a 3D CAD repair model of the damaged portion by scanning (step a). A later step b is analysing the repair model and thus evaluating complexity of the damage and/or its reconditioning. A later step c is, as a function of the complexity, deciding between four different computer programs and computers (in different locations)—which still may be reached by the aircraft owner's or operator's repair departments via some data network or even via the internet, so that the required calculation power is available depending on the evaluated complexity of the damage and/or its reconditioning.

Step c is, as a function of the complexity, deciding between four different computer programs to perform a following step d: analysing, by that decided computer program and computer, the repair model and thus dimensioning the reconditioning including the insert.

The method of FIG. 1 is ended by the repair itself: step e of producing the insert by means of 3D printing; and step f of inserting the insert into the damaged portion and fastening the insert to the component.

FIG. 2 to FIG. 6 show different damages 2 as a result of a prior step (not shown) of working the damaged portion 2 by removing material from the damaged portion by means of CAM—such that the damaged portion is simplified (having walls 8 rectangular (FIG. 2 to FIG. 4) to the flat outer surfaces 10 of the damaged aircraft skin 4, e.g.).

The insert 6 is produced having at least one surface 12 complementary to the worked damage 8 (and thus to the CAD repair model after the working step; not shown). In the step of working the damaged portion, the damaged portion was prepared for a simpler shape of the insert (having the rectangular cylindrical walls 8 in FIG. 2 to FIG. 4, e.g.), into which the accordingly produced insert 6 fits (having the rectangular cylindrical walls 12 in FIG. 2 to FIG. 4, e.g.) in a complementary way, as to be seen in FIG. 2 to FIG. 6.

The insert 6 is produced having fastening structures 14, in the form of a pin or a rivet, integrated—as being one piece and of one material (made by 3D printing). The damaged portion 2 is worked, thus, creating a complementary structure 16 adopted to cooperate with the fastening structure 14.

This again is made by removing material from the damaged portion 2 by means of CAM—and creating a complementary structure (a hole for the pin or rivet) adopted to cooperate with the fastening structure 14, namely to be inserted and locked a usual for a rivet and/or glued, e.g.

Finally, the fastened insert 6 (respective lower drawing in FIG. 2 to FIG. 6), after inserting it (respective upper drawing in FIG. 2 to FIG. 6) into the damage 2, bridges and fills the damage 2 in a shape so that the damage 2 is reconditioned as, in particular, mechanically and aerodynamically required.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of reconditioning a damaged portion of an aircraft component, the method comprising the steps of:
    scanning the damaged portion to produce a 3D CAD repair model of the damaged portion;
    analyzing the repair model to evaluate complexity of the damaged portion and/or complexity of reconditioning of the damaged portion;
    selecting, as a function of the evaluated complexity, between a plurality of different computer programs of a plurality of different computers, wherein the selecting results in a selected computer program of a selected computer having available calculation power for the evaluated complexity;
    analyzing the repair model with the selected computer program of the selected computer to calculate dimensional and/or mechanical parameters for reconditioning of the damaged portion, including information required to produce an insert to be used to repair the damaged portion.

2. The method according to claim 1, further comprising the step of removing material from the damaged portion to simplify shape of the damaged portion.

3. The method according to claim 2, further comprising the step of simplifying the CAD repair model.

4. The method according to claim 1, wherein the step of analyzing the repair model to evaluate complexity is performed by comparing the repair model with a 3D CAD original model of the damaged portion in an original and undamaged status.

5. The method according to claim 1, wherein the step of analyzing the repair model to evaluate complexity is performed using dimensional and/or mechanical parameters of the repair model.

6. The method according to claim 1, wherein the step of analyzing the repair model with the selected computer program is performed by comparing the repair model with a 3D CAD original model of the damaged portion in an original and undamaged status.

7. The method according to claim 1, further comprising the step of:
    producing the insert.

8. The method according to claim 7, wherein the insert is produced having at least one surface complementary to the CAD repair model.

9. The method according to claim 7, wherein the insert is produced having at least one fastening structure integrated and wherein the method comprises the step of working the damaged portion and thus creating a complementary structure adopted to cooperate with the fastening structure creating a complementary structure adopted to cooperate with the fastening structure.

10. The method according to claim 7, further comprising the step of:
    inserting the insert into the damaged portion and fastening the insert to the component.

* * * * *